United States Patent
Vigilante et al.

(10) Patent No.: US 11,211,136 B2
(45) Date of Patent: Dec. 28, 2021

(54) MEMORY SYSTEM TESTER USING TEST PAD REAL TIME MONITORING

(71) Applicant: Micron Technology, Inc., Boise, ID (US)

(72) Inventors: Andrea Vigilante, Milan (IT); Gianluca Scalisi, Castelverde (IT); Andrea Pozzato, Paderno Dugnano (IT); Andrea Salvioni, Muggio (IT); Mauro Luigi Sali, Sant'Angelo Lodigiano (IT)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 16/453,745

(22) Filed: Jun. 26, 2019

(65) Prior Publication Data

US 2020/0411129 A1 Dec. 31, 2020

(51) Int. Cl.
*G11C 29/38* (2006.01)
*G11C 29/36* (2006.01)
(Continued)

(52) U.S. Cl.
CPC .......... *G11C 29/38* (2013.01); *G11C 16/0483* (2013.01); *G11C 29/36* (2013.01);
(Continued)

(58) Field of Classification Search
CPC .... G01R 31/275; G01R 31/319; G01R 31/70; G11C 29/12005; G11C 29/38; G11C 16/0483; G11C 29/36; G11C 16/10; G11C 16/14; G11C 16/26; G11C 2216/18; G06F 11/221
See application file for complete search history.

(56) References Cited

U.S. PATENT DOCUMENTS 6,430,717 B1    8/2002  Noji
6,473,871 B1 *  10/2002 Coyle .................. G06F 11/221
                                                          714/715
(Continued)

OTHER PUBLICATIONS

"Taiwanese Application Serial No. 109114442, Voluntary Amendment Filed Oct. 29, 2020", w/ English Claims, 57 pgs.

(Continued)

*Primary Examiner* — April Y Blair
*Assistant Examiner* — Sazzad Hossain
(74) *Attorney, Agent, or Firm* — Schwegman Lundberg & Woessner, P.A.

(57) ABSTRACT

A variety of applications can include systems and methods that include a memory system tester having an analyzer coupled to a test flow controller. The test flow controller can be arranged to generate test signals to a memory system with the analyzer arranged to couple to test pads of a package platform for the memory system. The analyzer can provide data to the test flow controller to conduct testing and/or debugging of the memory system, with the data based on real time monitoring of the test pads of the package platform. In various embodiments, the analyzer can provide data feedback to the test flow controller in real time such that the test flow controller can control the flow of test signals to the memory system in real time. Additional apparatus, systems, and methods are disclosed.

27 Claims, 7 Drawing Sheets

(51) Int. Cl.
*G11C 16/04* (2006.01)
*G11C 16/10* (2006.01)
*G11C 16/14* (2006.01)
*G11C 16/26* (2006.01)
*G01R 31/319* (2006.01)
*G11C 29/12* (2006.01)
*G01R 31/70* (2020.01)
*G06F 11/22* (2006.01)
*G01R 31/27* (2006.01)

(52) U.S. Cl.
CPC .......... *G01R 31/275* (2013.01); *G01R 31/319* (2013.01); *G01R 31/70* (2020.01); *G06F 11/221* (2013.01); *G11C 16/10* (2013.01); *G11C 16/14* (2013.01); *G11C 16/26* (2013.01); *G11C 29/12005* (2013.01); *G11C 2216/18* (2013.01)

(56) References Cited

U.S. PATENT DOCUMENTS

| | | |
|---|---|---|
| 2009/0003103 A1* | 1/2009 | Shimizu ................ G11C 29/56 365/201 |
| 2013/0036254 A1 | 2/2013 | Fai et al. |
| 2015/0187410 A1 | 7/2015 | Nelson et al. |
| 2017/0004063 A1* | 1/2017 | Broderick ........... G06F 11/3636 |
| 2018/0012867 A1 | 1/2018 | Kim et al. |
| 2018/0286472 A1 | 10/2018 | Matsui et al. |
| 2019/0066815 A1* | 2/2019 | Chiu .................... G11C 29/021 |
| 2020/0411127 A1 | 12/2020 | Vigilante et al. |

OTHER PUBLICATIONS

"Korean Application Serial No. 10-2020-0077077, Notice of Preliminary Rejection dated Jun. 17, 2021", w/ English translation, 5 pgs.

U.S. Appl. No. 16/453,712, filed Jun. 26, 2019, Managed-NAND Real Time Analyzer and Method.

"Taiwanese Application Serial No. 109114442, Office Action dated Apr. 19, 2021", w English Translation, 29 pgs.

* cited by examiner

MEMORY SYSTEM TESTER USING TEST PAD REAL TIME MONITORING

BACKGROUND

Memory devices are typically provided as internal, semiconductor, integrated circuits in computers or other electronic devices. There are many different types of memory, including volatile and non-volatile memory. Volatile memory requires power to maintain its data, and examples of volatile memory include random-access memory (RAM), dynamic random-access memory (DRAM), and synchronous dynamic random-access memory (SDRAM), among others. Non-volatile memory can retain stored data when not powered, and examples of non-volatile memory include flash memory, read-only memory (ROM), electrically erasable programmable ROM (EEPROM), erasable programmable ROM (EPROM), resistance variable memory, such as phase-change random-access memory (PCRAM), resistive random-access memory (RRAM), and three-dimensional (3D) XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the memory cells in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. Unless otherwise clearly indicated by express language or context, MLC is used herein in its broader context, to refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storage cells of the string. In the example of a vertical string, the polysilicon structure may be in the form of a vertically extending pillar. In some examples, the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells, to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs can also include DRAM or SRAM (or other forms of memory die or other memory structures). The SSD can receive commands from a host in association with memory operations, such as read or write operations, to transfer data (e.g., user data and associated integrity data, such as error data and address data, etc.) between the memory devices and the host, or erase operations to erase data from the memory devices.

In general, a managed NAND system, also referred to as managed NAND, is realized as a combination of one or more individual NAND flash memory devices combined with a hardware controller that performs management features for the flash memories. SSD, UFS, and eMMC devices can be managed NAND memory systems that include processing circuitry such as memory controllers, direct memory access (DMA) controllers, and flash memory interface circuitry to manage the access to physical memory. At various times, in the lifetime of these memory systems beginning with memory system design, testing and/or debugging of the respective managed NAND memory systems is conducted. Enhancements with respect to the testing and/or debugging instruments and operational procedures associated with such instruments can provide improved efficiencies for testing and/or debugging.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
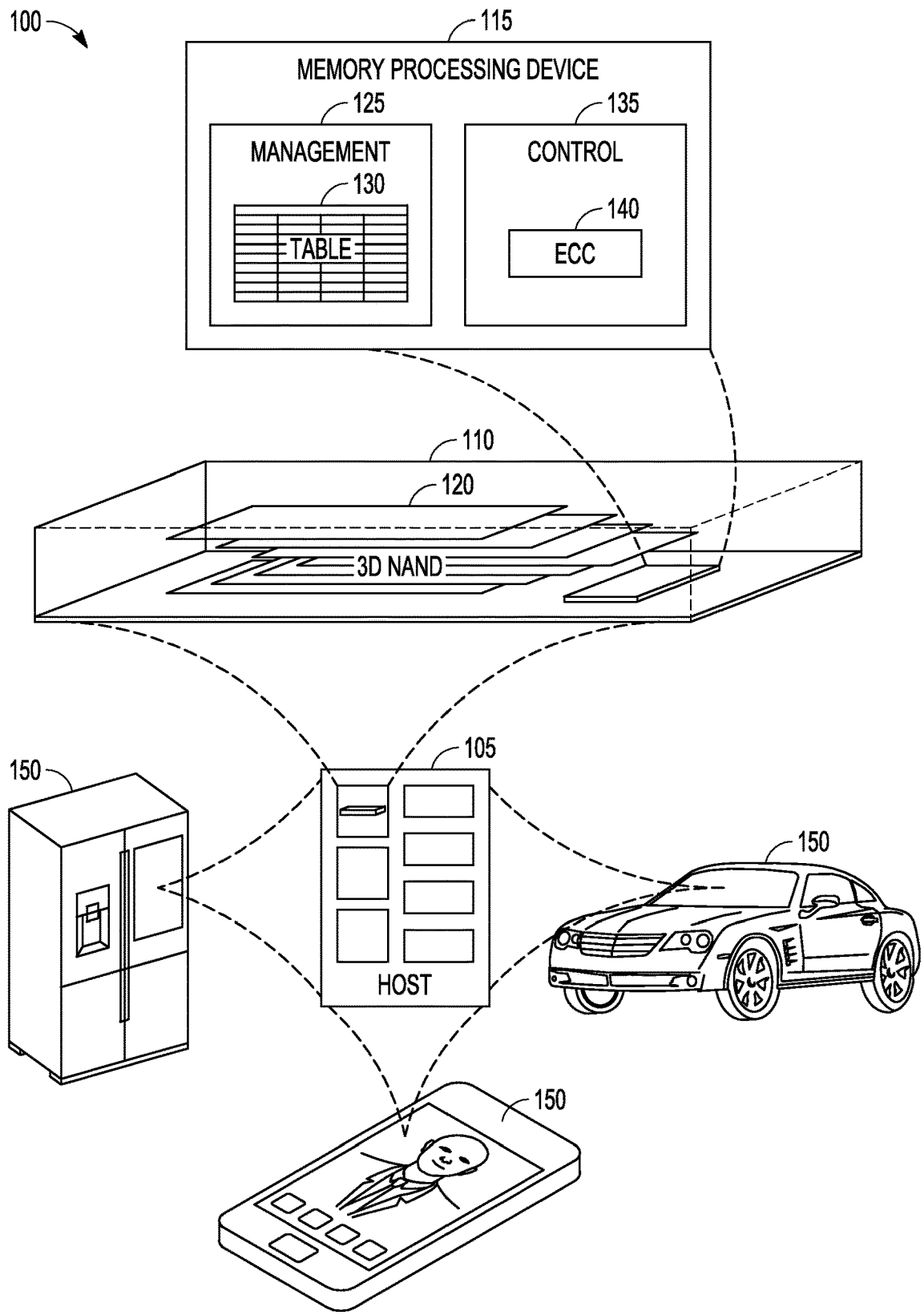
FIG. 1 illustrates an example of an environment including a memory device, according to various embodiments.

The following detailed description refers to the accompanying drawings that show, by way of illustration and not limitation, various embodiments in which an invention can be practiced. These embodiments are described in sufficient detail to enable those skilled in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Typically, in a conventional arrangement of a NAND testing mode for failure analysis, a NAND tester coupled to a NAND interface is used to couple to a NAND bus of the managed NAND system to test a NAND device of the managed NAND system. Optionally, a conventional managed NAND tester coupled to a managed NAND interface is used to couple to the NAND bus of the managed NAND system, through a controller of the managed NAND system with the controller forced to a high impedance state, to test the NAND device of the managed NAND system. Typically, in a conventional arrangement of a NAND verification mode for debugging, a conventional managed NAND tester coupled to a managed NAND interface is used to couple to the NAND bus of the managed NAND system, through the controller of the managed NAND system, to debug the NAND device of the managed NAND system by a separate conventional logic analyzer coupled to the NAND bus via a NAND interface.

In various embodiments, a memory tester can be implemented with a test flow controller integrated with an analyzer. The analyzer can be arranged as a real time analyzer. The memory tester can be structured as a managed NAND memory tester. Signals and information generated in real time from the analyzer of the memory tester can be used by the test flow controller of the memory tester to drive the flow of testing to provide testing and debugging of a managed NAND system. Both a managed NAND interface and a NAND interface can be simultaneously used to provide advanced managed NAND testing in which the managed NAND test flow depends on the status of NAND device internal voltages and/or managed NAND internal voltages determined by real time monitoring of test pads.

The analyzer can be structured as a managed NAND real time analyzer to process in real time mode NAND activity in a managed NAND memory system. The real time mode can provide for the production of NAND operations counting, for example, write amplification factor (WAF). The real time mode can provide for the production of NAND operations distribution, for example, wear-leveling. The real time mode can provide for the production of NAND operations logger, for example, firmware reversing. The real time mode can provide for the production of NAND operation status signal, for example, managed NAND current peak analysis.

The analyzer can operate with logic analyzer functions that can provide logging of the full description of commands and addresses of NAND operations to a NAND device of the managed NAND system. Real time processing of the logging can be conducted without test time constraint, which can enable NAND coverage and wear-leveling, for example. Data from the analyzer of the memory tester can be used by the memory tester to provide a trigger that can initiate production of a specific test of a memory system to which the memory tester is coupled.

Such a memory tester with integrated test flow controller and analyzer can provide a number of functions in operation with a managed NAND system. The memory tester can monitor internal voltages of the managed NAND system using test pads of a package platform on which the managed NAND system is disposed. The memory tester can work fully with power manager tools. For example, the memory tester in conjunction with power manager tools can perform peak current analysis. The power manager tools may optionally be integrated with the memory tester. The memory tester can be constructed to be compatible with performance of development steps of a managed NAND system, for example, in analysis of firmware (FW) overhead and power loss effectiveness. The analyzer of such a memory tester can be fully embedded with a test flow controller in which the test flow controller is implemented in a field programmable gate array (FPGA). An analyzer, such as a real time analyzer, fully embeddable with a test flow controller in a FPGA-based system can provide a low cost approach to testing and/or debugging.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory processing device 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host device 105 may be a machine having some portion, or all, of the components discussed in reference to the machine 500 of FIG. 5.

The memory processing device 115 can receive instructions from the host device 105, and can communicate with the memory array 120, such as to transfer data to (e.g., write or erase) or from (e.g., read) one or more of the memory cells, planes, sub-blocks, blocks, or pages of the memory array 120. The memory processing device 115 can include, among other things, circuitry or firmware, including one or more components or integrated circuits. For example, the memory processing device 115 can include one or more memory control units, circuits, or components configured to control access across the memory array 120 and to provide a translation layer between the host device 105 and the memory device 110. The memory processing device 115 can include one or more input/output (I/O) circuits, lines, or interfaces to transfer data to or from the memory array 120. The memory processing device 115 can include a memory manager 125 and an array controller 135.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more components of the memory device 110 (e.g., various information associated with a memory array or one or more memory cells coupled to the memory processing device 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory processing device 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory processing device 115. The memory operations can be based on, for example, host commands received from the host device 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory processing device 115. The memory processing device 115 can be configured to actively detect and recover from error occurrences (e.g., bit errors, operation errors, etc.) associated with various operations or storage of data, while maintaining integrity of the data transferred between the host device 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages and erased in blocks. However, one or more memory operations (e.g., read, write, erase, etc.) can be performed on larger or smaller groups of memory cells, as desired. The data transfer size of a NAND memory device 110 is typically referred to as a page; whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
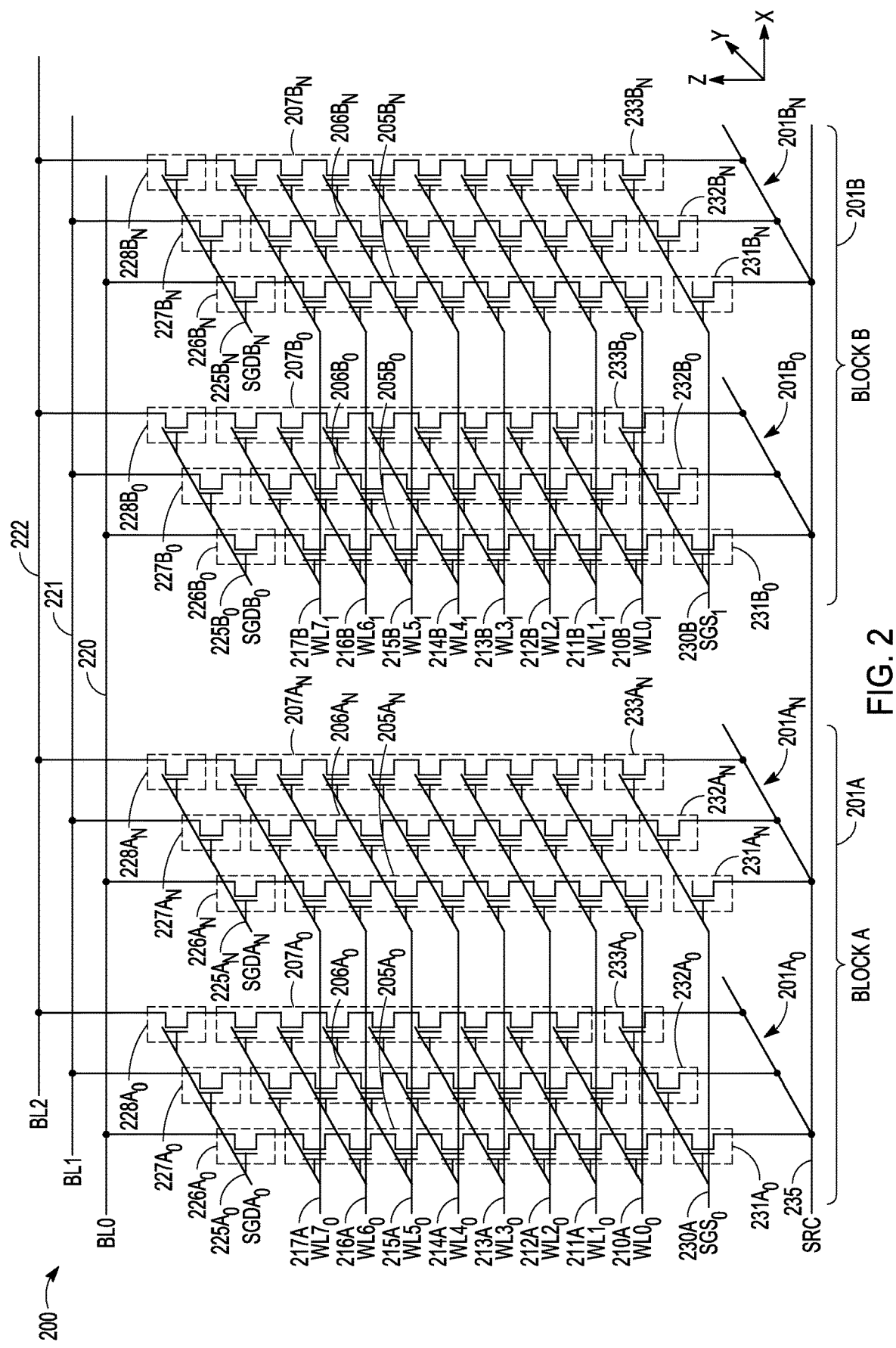
FIGS. 2 and 3 illustrate schematic diagrams of an example of a three-dimensional NAND architecture semiconductor memory array, according to various embodiments.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures than would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array 200 can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array 200, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the memory array 200 can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
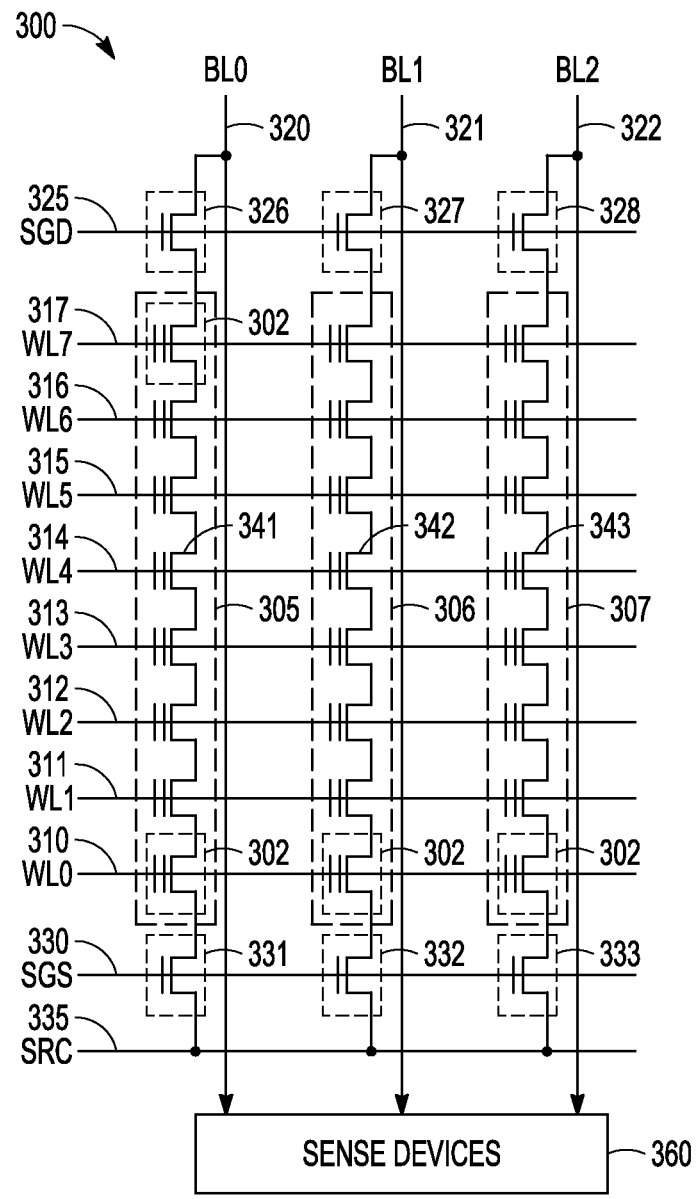

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense devices 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
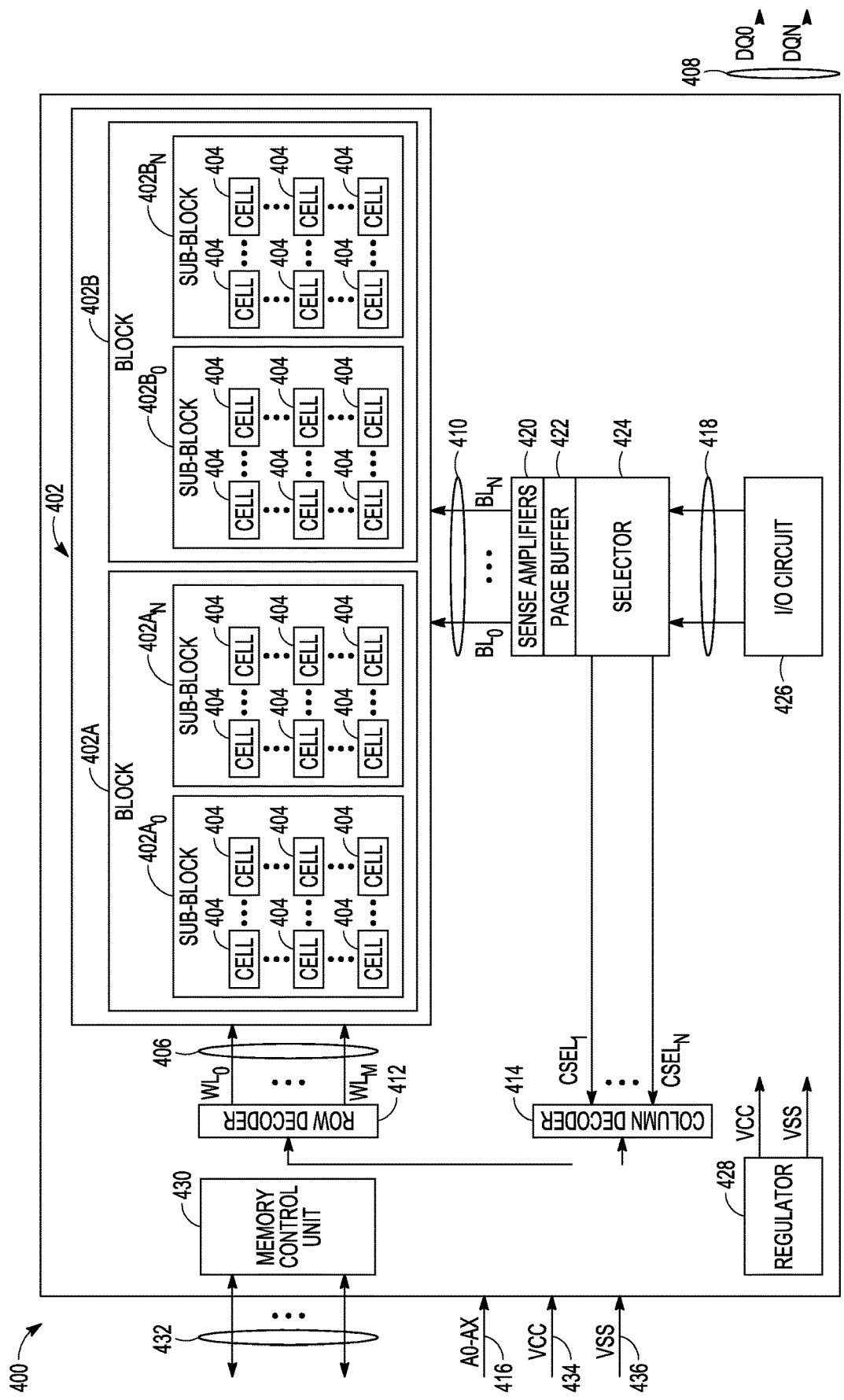
FIG. 4 illustrates an example block diagram of a memory module, according to various embodiments.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address lines 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address lines 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402 or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
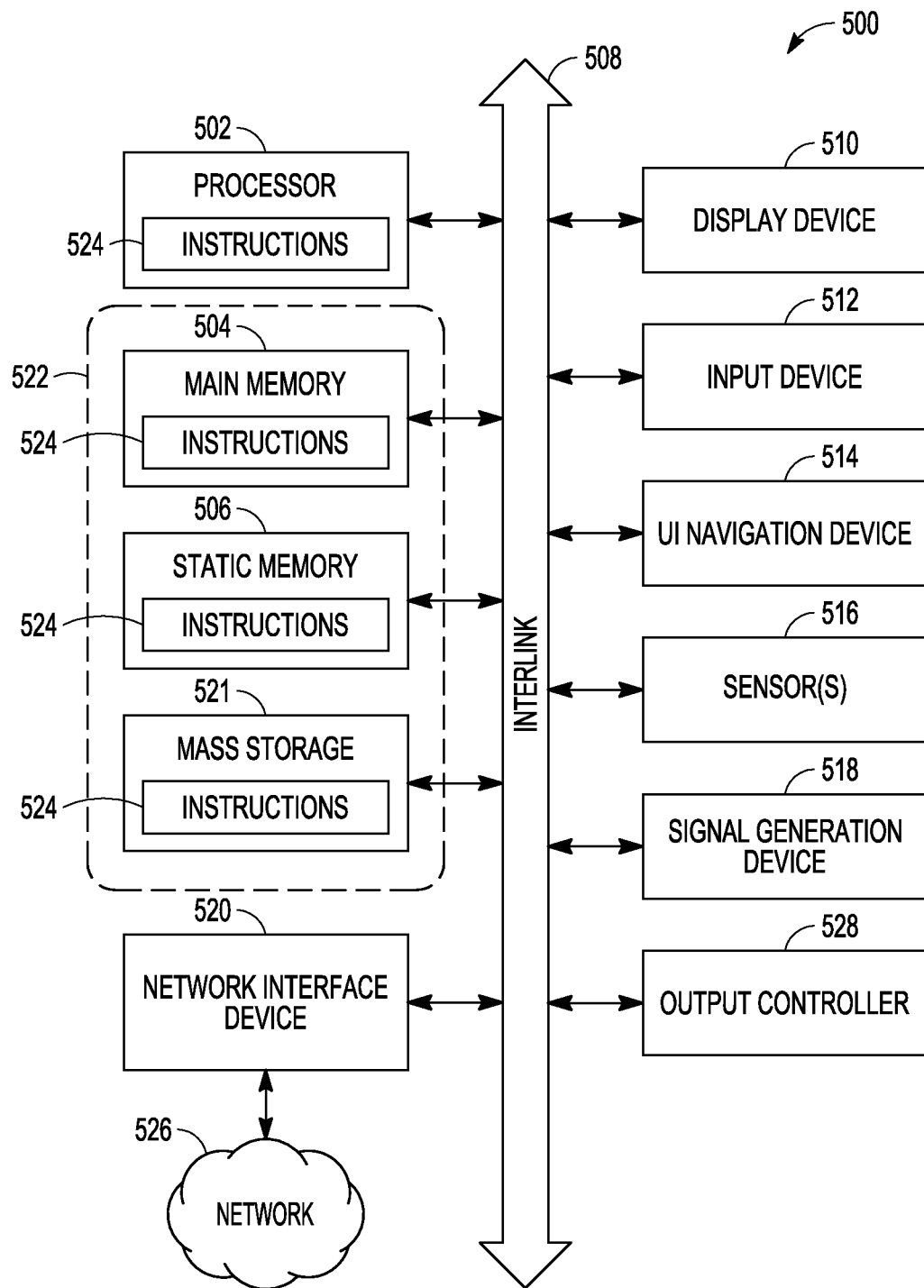
FIG. 5 is a block diagram illustrating an example of a machine upon which one or more embodiments may be implemented, according to various embodiments.

FIG. 5 illustrates a block diagram of an example machine 500 upon which any one or more of the techniques (e.g., methodologies) discussed herein may perform. In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 500 (e.g., the host device 105, the memory device 110, etc.) may include a hardware processor 502 (e.g., a central processing unit (CPU), a graphics processing unit (GPU), a hardware processor core, or any combination thereof, such as the memory processing device 115, etc.), a main memory 504 and a static memory 506, some or all of which may communicate with each other via an interlink (e.g., bus) 508. The machine 500 may further include a display device 510, an alphanumeric input device 512 (e.g., a keyboard), and a user interface (UI)

navigation device 514 (e.g., a mouse). In an example, the display device 510, input device 512, and UI navigation device 514 may be a touch screen display. The machine 500 may additionally include a storage device (e.g., drive unit) 521, a signal generation device 518 (e.g., a speaker), a network interface device 520, and one or more sensors 516, such as a global positioning system (GPS) sensor, compass, accelerometer, or other sensor. The machine 500 may include an output controller 528, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 521 may include a machine-readable medium 522 on which is stored one or more sets of data structures or instructions 524 (e.g., software) embodying or utilized by any one or more of the techniques or functions described herein. The instructions 524 may also reside, completely or at least partially, within the main memory 504, within static memory 506, or within the hardware processor 502 during execution thereof by the machine 500. In an example, one or any combination of the hardware processor 502, the main memory 504, the static memory 506, or the storage device 521 may constitute the machine-readable medium 522.

While the machine-readable medium 522 is illustrated as a single medium, the term "machine-readable medium" may include a single medium or multiple media (e.g., a centralized or distributed database, or associated caches and servers) configured to store the one or more instructions 524.

The term "machine-readable medium" may include any medium that is capable of storing, encoding, or carrying instructions for execution by the machine 500 and that cause the machine 500 to perform any one or more of the techniques of the present disclosure, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 524 (e.g., software, programs, an operating system (OS), etc.) or other data, which are stored on the storage device 521, can be accessed by the memory 504 for use by the processor 502. The memory 504 (e.g., DRAM) is typically fast, but volatile, and thus a different type of storage than the storage device 521 (e.g., an SSD), which is suitable for long-term storage, including while in an "off" condition. The instructions 524 or data in use by a user or the machine 500 are typically loaded in the memory 504 for use by the processor 502. When the memory 504 is full, virtual space from the storage device 521 can be allocated to supplement the memory 504; however, because the storage device 521 is typically slower than the memory 504, and write speeds are typically at least twice as slow as read speeds, use of virtual memory can greatly reduce user experience due to storage device latency (in contrast to the memory 504, e.g., DRAM). Further, use of the storage device 521 for virtual memory can greatly reduce the usable lifespan of the storage device 521.

In contrast to virtual memory, virtual memory compression (e.g., the Linux® kernel feature "ZRAM") uses part of the memory as compressed block storage to avoid paging to the storage device 521. Paging can take place in the compressed block until it is time to write such data to the storage device 521. Virtual memory compression increases the usable size of memory 504, while reducing wear on the storage device 521.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 524 may further be transmitted or received over a communications network 526 using a transmission medium via the network interface device 520 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. The term "transmission signal" shall be taken to include any signal that is capable of storing, encoding, or carrying instructions for execution by the machine 500, and includes digital or analog communications signals or other signals to facilitate communication of such software.

Figure 6:
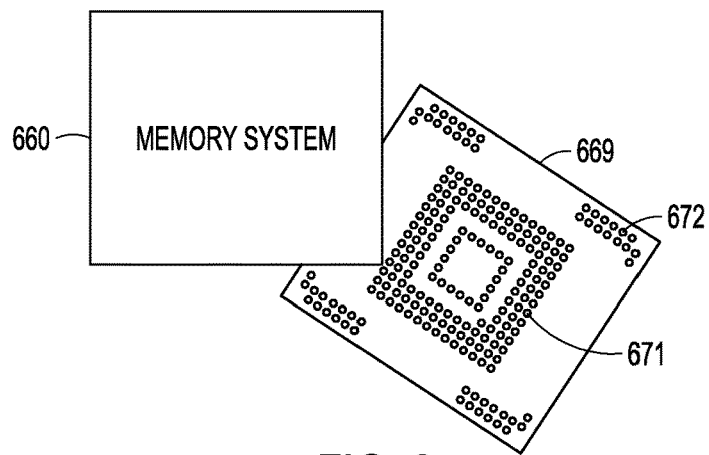
FIG. 6 shows an example of a memory system in package form that can be attached to a package platform, according to various embodiments.

FIG. 6 shows an embodiment of an example of a memory system 660 in package form that can be attached to a package platform 669. Connection nodes 671 located in the central area of the package platform 669 can be implemented as pads for passing signals and power to the memory system 660 when coupled to the package platform 669. The connection nodes 671 can be implemented as a balls array, defined by a standard of the Joint Electron Device Engineering Council (JEDEC). The connection nodes 671 can be used to provide input signals, return output signals, and power levels to the components of the memory system 660. This application of the connection nodes 671 for coupling to the memory system 660 can be used with the package platform 669 disposed in a final application of the memory system 660 in a product.

The memory system 660 can be realized in a number of different formats. The memory system 660 can include a memory device, multiple memory devices, or one or more memory devices along with processing circuitry. The processing circuitry can include, but is not limit to, circuitry such as memory controllers, direct memory access (DMA) controllers, and memory interface circuitry to manage the access to physical memory of the one or more memory devices. The memory system 660 can include SSD, UFS, and eMMC devices, or one or more other memory devices. The memory system 660 can include a managed NAND system. The memory system 660 can include one or more processors or other memory controllers performing logic functions to operate the memory devices or interface with external systems.

The memory system 660 can receive commands from a host in association with memory operations, such as read or write operations to transfer data (e.g., user data and associated integrity data, such as error data and address data, etc.) between memory devices of the memory system 660 and the host, erase operations to erase data from the memory devices, or perform one or more other memory operations. These commands and exchanges with the host can be provided through connection nodes 671 with the memory system 660 attached to the package platform 669, with the package platform 669 in communication with the host or with multiple hosts.

Connection nodes 672 located in the peripheral area are connections whose use are provided as a contact mechanism that can be defined by a memory vendor. The connection nodes 672 can be structured as test pads without balls. The connection nodes 672 can be used for testing. After testing, memory system 660 coupled to the package platform 669 can be made available for insertion in a final application of the memory system 660 in a product. The connection nodes 672 can be masked from host access with the memory system 660 coupled to the package platform 669 in the product application. In other applications, the connection nodes 672 can be provided for host access with the memory system 660 coupled to the package platform 669 in the product of the other applications for testing in the product application environment. Alternatively, after testing, the memory system 660 can be decoupled from the package platform 669 and can be made available for coupling to another package platform in a final application of the memory system 660 in a product. On the other package platform, the connection nodes 672 can be masked or used for testing in the product application environment.

Figure 7:
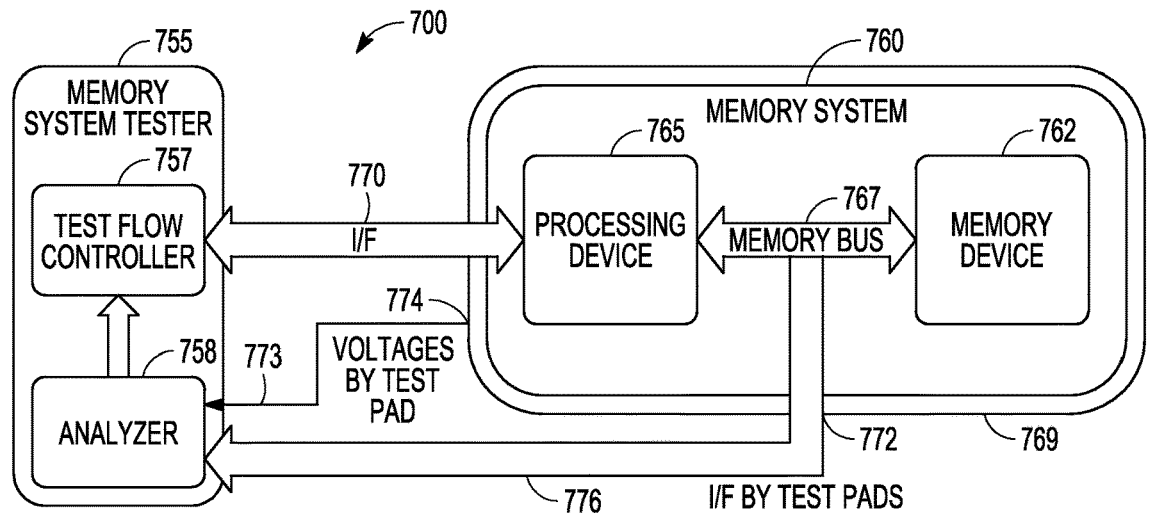
FIG. 7 is a block diagram of an example system having a memory system tester operable to test and/or debug a memory system, according to various embodiments.

FIG. 7 is a block diagram of an embodiment of an example system 700 having a memory system tester 755 operable to test and/or debug a memory system 760. The memory system 760 can operate in product applications similar to memory device 110 of FIG. 1. The memory system 760 can be coupled to a package platform 769 having test pads 772 and 774. The memory system 760 and the package platform 769 can be structured similar to the memory system 660 and the package platform 669 of FIG. 6. The memory system tester 755 can include a test flow controller 757 and an analyzer 758, with the analyzer 758 coupled to the test flow controller 757. The test flow controller 757 can be arranged to generate test signals to the memory system 760. The analyzer 758 can be arranged to couple to the test pads 772 and 774 of the package platform 769 for the memory system 760, with the analyzer 758 operable to provide data to the test flow controller 757 to conduct testing and/or debugging of the memory system 760. The data can be based on real time monitoring of the test pads 772 and/or 774 of the package platform 769.

The analyzer 758 can be implemented as a real time analyzer 758 to monitor and receive data from the memory system 760 in real time and to provide analysis real time to the test flow controller 757. In various embodiments, the analyzer 758 can provide data feedback to the test flow controller 757 in real time such that the test flow controller 757 can control the flow of test signals to the memory system 760 in real time. The test flow controller 757 and the analyzer 758 can be integrated together in a field programmable gate array system.

The test flow controller 757 can generate a flow of test signals to the memory system 760 via an interface (I/F) 770 that couples to a processing device 765 of the memory system 760. The I/F 770 can be realized as a bus. The I/F 770 can be coupled to connections nodes (not shown) of the package platform 769. These connection nodes can be similar to the connection nodes 671 of the package platform 669 of FIG. 6, which connection nodes to couple to the memory system 760 are located in a central area of package platform 769. These connection nodes of the package platform 769 that couple with I/F 770 can be used to couple to a host, after testing and/or debugging of the memory system 760 by the memory system tester 755 is completed. The test signals generated from the test flow controller 757 can be received by the processing device 765 for routing to the memory device 762 over a memory bus 767. The memory device 762 can be implemented as multiple memory devices, in which case the processing device 765 provides appropriate signals to select a memory device from the set of multiple memory devices. The processing device 765 can be implemented as one or more processors. The one or more processors can be implemented as one or more memory controllers.

The analyzer 758 can be coupled to test pads 774 by an I/F 773. The test pads 774 can be arranged as part of the package platform 769 as a number of test pads of the package platform 769 at which the respective test pads 774 reflect the internal voltages of the memory system 760. The internal voltages can include, but are not limited to, various supply voltages, reference voltages, ground reference, and other voltages for operation of the memory system 760. The test pads 774 can be located on a peripheral area of the package platform 769 similar to the connection nodes 672 of the package platform 669 of FIG. 6. The test pads 774 allow determination of the status of internal voltages of the memory system 760 monitored by the analyzer 758. The status of the internal voltages monitored by the analyzer 758 can be provided to the test flow controller 757. The test flow controller 757 can control flow of testing of the memory system 760 based on the status provided.

The analyzer 758 can be coupled to test pads 772 by an I/F 776. The test pads 772 can be located on a peripheral area of the package platform 769 similar to the connection nodes 672 of the package platform 669 of FIG. 6. The test pads 772 provide coupling to the memory bus 767 of the memory system 760. The test pads 772 allow monitoring of signals between the processing device 765 and the memory device 762. The monitored signals can include commands, control signals, and data. The monitored signals are provided to the analyzer 758 from the memory bus 767 via the test pads 772 by the I/F 776.

The test flow controller 757 can be arranged to couple to the I/F 770 to generate commands to the processing device 765 of the memory system 760 and to control processing of execution of memory commands by the memory system 760. For example, for a program command generated for testing, the test flow controller 757 can stop programming the memory system 760 in response to data from the analyzer 758 including a determination that programming errors in number have reached or exceeded a threshold for a number of errors allowed. The programming errors in number can be based on real time monitoring of the bus 767 coupling the processing device 765 to the memory device 762 of the memory system 760, where the monitoring is executed by the analyzer 758 using a number of the test pads 772.

The test flow controller 757 can be implemented as a combination of processing devices and memory storage with other circuitry to control test flow. The processing devices can be implemented as one or more processors, one or more controllers, logic circuitry, or combinations thereof. The memory storage can be implemented to include one or more memory devices, a set of registers, or combinations thereof. The memory storage can include instructions executed by the processing devices to control testing and/or debugging of the memory device 762 and/or the memory system 760. The testing and the debugging can include generation of various memory commands.

The analyzer 758 can be implemented as a combination of processing devices and memory storage with other circuitry to monitor for signals, analyze the monitored signals, and provide data to the test flow controller 757. The processing devices can be implemented as one or more processors, one or more controllers, logic circuitry, or combination thereof. The memory storage can be implemented to include one or more memory devices, a set of registers, or combinations thereof. The memory storage can include instructions executed by the processing devices of the analyzer 758 to control monitoring of the memory bus 767 between the processing device 765 and the memory device 762 and analyze data from the monitoring. The monitoring and analysis can include the logging of data correlated to monitored signals and measuring of time associated with commands generated by the test flow controller 757. In various embodiments, the analyzer 758 can provide data feedback to the test flow controller 757 in real time, regarding various functions of the memory system 760, such that the test flow controller 757 can control the flow of test signals to the memory system 760 in real time to conduct testing and/or debugging of the memory system 760 using the I/F 770 with the I/F 776, the IF 773, or a combination of both the I/F 776 and the I/F 773 simultaneously.

In various embodiments, the analyzer 758 can be structured as a managed NAND analyzer. The managed NAND analyzer can be implemented as a real time managed NAND analyzer. The memory system 760 having memory device 762 and memory bus 767 can be realized by a managed NAND system having one or more NAND memory devices and a NAND bus, respectively. The I/F 770 can be implemented as a managed NAND bus providing a managed NAND interface. The I/F 776 can be implemented by a NAND I/F.

For a managed NAND system, the memory system tester 755 enables managed NAND status monitoring, NAND measurements, and debug functions during managed NAND testing. With respect to managed NAND status monitoring, a check can be performed when a NAND page program or block erase is greater than a given quantity. The analyzer 758 in conjunction with the test flow controller 757 is operable to determine in real time when a number of NAND page programs or block erases is greater than a threshold for page programs or block erases. The analyzer 758 can monitor the NAND memory bus 767 with the NAND memory bus 767 coupling the processing device 765 of the managed NAND system 760 to one or more NAND devices of the managed NAND system 760, where the monitoring can be executed by use of the test pads 772 of the set of test pads of the package platform 769 coupled to the NAND memory bus 767.

With respect to managed NAND status monitoring, a check can be performed when a NAND modify operation is on-going to perform a power loss test. The analyzer 758 can be structured to communicate to the test flow controller 757 that a NAND operation is in progress. In response to receiving communication that the NAND operation is in progress, the test flow controller 757 can conduct a power loss test during the NAND operation in progress.

With respect to managed NAND status monitoring, internal voltages for NAND and controller power manager testing can be monitored. The analyzer 758 can be arranged to generate a communication to the test flow controller 757 that a NAND operation is in progress. In response to reception of the communication that the NAND operation is in progress, the test flow controller 757 can conduct testing of NAND management and controller power management during the NAND operation in progress, with the analyzer 758 arranged to monitor internal voltages of the managed NAND system to conduct the testing in conjunction with the test flow controller 757.

With respect to NAND-related measurements, NAND busy time can be measured to evaluate firmware overhead. For example, time measurements can include a determination of the difference between managed NAND system performance and NAND performance. The memory system tester 755 can be implemented to evaluate firmware of the managed NAND memory system 760 by measurement of time associated with execution of a NAND operation from generation of a command to perform the NAND operation by the test flow controller 757 and measurement of time associated with signals, corresponding to the execution of the command, by the analyzer 758. With the NAND memory bus 767 coupling the processing device 765 of the managed NAND memory system 760 to one or more NAND devices of the managed NAND memory system 760, the analyzer 758 can monitor the NAND bus 767 of the managed NAND system 760 using a number of test pads 772 coupled to the NAND memory bus 767 with the managed NAND system 760 coupled to the package platform 769. The time at which a command is sent from the test flow controller 757 to the managed NAND system 760 via I/F 770 can be logged. The time at which the command is sent from the processing device 765 to the memory device 762 can be determined from monitoring the memory bus 767 by the analyzer 758 via the test pads 772 and the I/F 776. The notifications and the time of the notifications regarding the command from the memory device 762 to the processing device 765 can be monitored and logged by the analyzer 758 via the test pads 772 and the I/F 776. Other activities, along with the associated time of the activities, between the memory device 762 and the processing device 765 regarding the command can be monitored and logged by the analyzer 758 via the test pads 772 and the I/F 776. The response to the command, along with its associated time, from the managed NAND system 760 to the test flow controller 757 via I/F 770 can be logged. From the time-related data collected in real time, the memory system tester 755 can evaluate the firmware of the managed NAND memory system 760.

With respect to NAND-related measurements, NAND test coverage and NAND wear-levelling can be produced without test time constraint. The memory system tester 755 can provide test coverage of operations on a NAND device of the managed NAND memory system 760 and/or measure wear-leveling of the NAND device from a monitoring of a NAND memory bus 767 of the managed NAND system 760 to check the status of the NAND device of the managed NAND system 760 directly.

With respect to NAND-related measurements, the memory system tester 755 can enable correlation between NAND operations and peak current. The analyzer 758 in conjunction with the test flow controller 757 is operable to determine a correlation between NAND operations and peak current in a NAND device of the managed NAND memory system 760. The test flow controller 757 can generate a command to execute an operation in a selected NAND of the managed NAND memory system 760. With respect to the execution of the operation, using test pads 772 of the set of test pads of the package platform 769, the analyzer 758 is operable to measure current in the managed NAND memory system 760, correlate the current with the operation that is ongoing in the selected NAND memory device, and produce a statistic with respect to peak current and status of the selected NAND memory device.

With respect to debugging, logging of the full description of NAND operations, including commands and addresses, can be performed by the analyzer 758, for example, as a logic analyzer. The analyzer 758 can include a log to hold commands and addresses associated with commands of NAND operations from monitoring of a number of the test pads 772 coupled to the NAND memory bus 767 with the managed NAND memory system 760 coupled to the package platform 769. The NAND memory bus 767 couples the processing device 765 of the managed NAND memory system 760 to one or more NAND devices of the managed NAND memory system 760. The analyzer 758 in conjunction with the test flow controller 757 can conduct debugging using the log.

In various embodiments, system 700 can include the package platform 769 with its test pads 772 and 774. In this arrangement, the memory system 760 is a workpiece for the memory system tester 755 of the system 700. In such an arrangement, I/F 770, I/F 773, and I/F 776 can also be part of the system 700.

Figure 8:
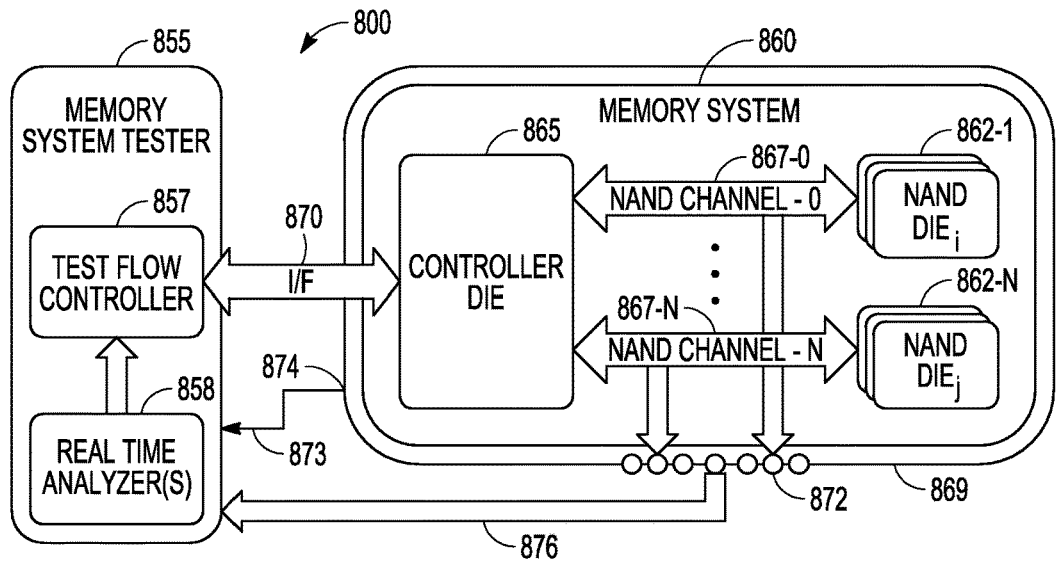
FIG. 8 is a block diagram of an example system having a memory system tester operable to test and/or debug a memory system with the memory system structured as a managed NAND memory system, according to various embodiments.

FIG. 8 is a block diagram of an embodiment of an example system 800 having a memory system tester 855 operable to test and/or debug a memory system 860 with the memory system 860 structured as a managed NAND memory system. The managed NAND system can be an eMMC system or an UFS system. The memory system 860 can operate in product applications similar to memory device 110 of FIG. 1. The memory system 860 can be coupled to a package platform 869 having test pads 872 and 874. The memory system 860 and the package platform 869 can be structured similar to the memory system 660 and the package platform 669 of FIG. 6. The memory system tester 855 can include a test flow controller 857 and an analyzer 858, with the analyzer 858 coupled to the test flow controller 857. The test flow controller 857 can be arranged to generate test signals to the memory system 860 via a managed NAND interface bus 870. The analyzer 858 can be arranged to couple to the test pads 872 and 874 of the package platform 869 for the memory system 860 via NAND I/Fs 876 and 873, respectively. The analyzer 858 is operable to provide data to the test flow controller 857 to conduct testing and/or debugging of the memory system 860. The data can be based on real time monitoring of the test pads 872 and/or 874 of the package platform 869. In various embodiments, the analyzer 858 can provide data feedback to the test flow controller 857 in real time, regarding various functions of the memory system 860, such that the test flow controller 857 can control the flow of test signals to the memory system 860 in real time to conduct testing and/or debugging of the memory system 860 using the I/F 870 with the I/F 876, the IF 873, or a combination of both the I/F 876 and the I/F 873 simultaneously.

The memory system tester 855 can be structured to perform functions with respect to managed NAND memory system 860 in a manner similar to the operation of the memory system tester 755 with respect to the memory system 760 as discussed above with respect to FIG. 7. For example, the test flow controller 857 can be arranged to control flow of testing or debugging of a NAND device of the managed NAND memory system 860 and/or the managed NAND memory system 860, based on status of internal voltages of the NAND device and/or the managed NAND memory system 860. The status can be monitored by the analyzer 858 at a number of test pads 874 of the set of test pads of the package platform 869 at which the respective test pads 874 reflect the internal voltages of the NAND device and/or the managed NAND memory system 860.

FIG. 8 provides an illustration of features that can be realized in the architecture of a memory system tester and a memory system of FIG. 7. The analyzer 858 can be structured as multiple analyzers. The analyzer 858 can also operate as a real time analyzer. The memory system under test, managed NAND system 860, can include a controller die 865 that is coupled to a number of sets of NAND die. A NAND die referred to herein is a NAND memory die. The sets of NAND die can include NAND set 862-1 . . . NAND set 862-N. The number of dies in each NAND set can vary among the sets of NAND die, for example, NAND set 862-1 can include a NAND die$_0$ to a NAND die$_d$ and NAND set 862-N can include a NAND die$_0$ to a NAND die$_j$. Each NAND set 862-1 . . . 862-N can be coupled to the controller die 865 by individual channels of a NAND bus, NAND Channel 867-0 . . . NAND Channel 867-N.

Each of NAND Channel 867-0 . . . NAND Channel 867-N can be separately coupled to test pads of the test pads 872. The analyzer 858 can monitor signals on each of NAND Channel 867-0 . . . NAND Channel 867-N through these different test pads via NAND I/F 876. The monitored signals can include commands, control signals, and data. In various embodiments, the analyzer 858 can be structured as multiple NAND analyzers with each NAND analyzer arranged to access one NAND channel of multiple NAND channels, NAND Channel 867-0 . . . NAND Channel 867-N, of the NAND bus of the managed NAND system 860, with the one NAND channel being different from channels accessed by other NAND analyzers of the multiple NAND analyzers. The access by each NAND analyzer can be conducted via test pads of the set of test pads 872 different from test pads used by the other NAND analyzers, with each NAND channel, NAND Channel 867-0 . . . NAND Channel 867-N, coupling one or more NAND dies to the controller die 865 of the managed NAND system 860. With the analyzer 858 structured as multiple analyzer, each analyzer of the multiple analyzers can monitor a selected one of NAND Channel 867-0 . . . NAND Channel 867-N. The different analyzers can monitor different channels. The individual analyzers of the multiple analyzers can provide data to the test flow controller 857 to test and/or debug selected ones of NAND dies of selected ones of NAND sets 862-1 . . . 862-N. The test flow controller 857 can also be structured as multiple test flow controllers.

In various embodiments, system 800 can include the package platform 869 with its test pads 872 and 874. In this arrangement, the managed NAND system 860 is a workpiece for the memory system tester 855 of the system 800. In such an arrangement, managed NAND interface bus 870, NAND I/F 873, and NAND I/F 876 are also part of the system 800.

Figure 9:
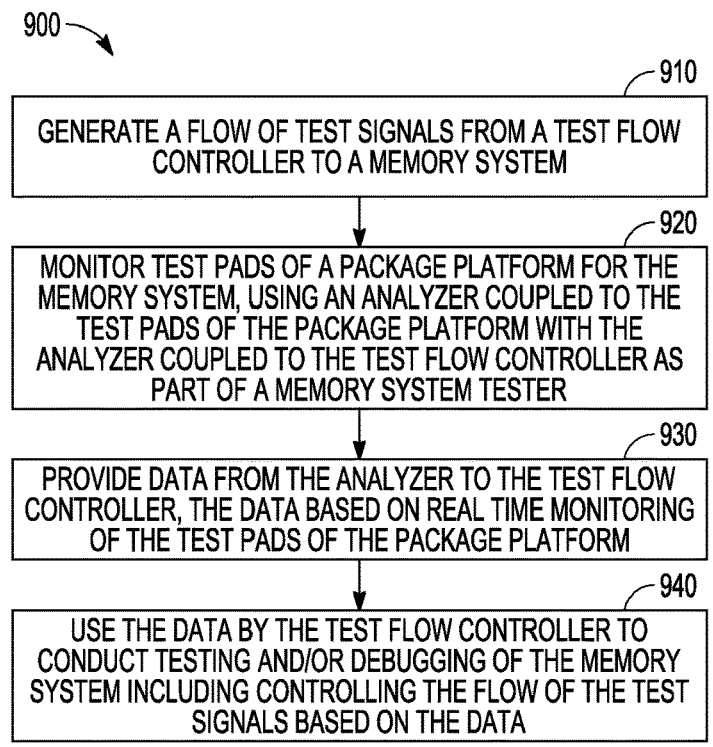
FIG. 9 is a flow diagram of features of an example method of conducting testing and/or debugging of a memory system, according to various embodiments.

FIG. 9 is a flow diagram of features of an embodiment of an example method 900 of conducting testing and/or debugging of a memory system. The method 900 can be implemented using a processing device executing instructions stored in data storage device. The method 900 can be applied to a memory system tester and memory system as taught herein such as associated with the systems of FIGS. 7, 8, and 10 or similar systems. The processing device can be implemented as one or more processors. At 910, a flow of test signals is generated from a test flow controller to a memory system. Generating the flow of test signals from the test flow controller to a memory system can include using a memory system interface coupled to a controller of the memory system, the memory system having one or more memory devices coupled to the controller of the memory system by a bus of the memory system. The controller can be realized as one or more processing devices. At 920, test pads of a package platform for the memory system are monitored using an analyzer coupled to the test pads of the package platform with the analyzer coupled to the test flow controller as part of a memory system tester. The test flow controller and the analyzer can be integrated together in a field programmable gate array system. The analyzer can be coupled to the test pads of the package platform via an interface to the test pads, with the test pads coupled to the bus of the memory system.

At 930, data is provided from the analyzer to the test flow controller, where the data is based on real time monitoring of the test pads of the package platform. At 940, the data is used by the test flow controller to conduct testing and/or debugging of the memory system including controlling the flow of the test signals based on the data. The testing and/or debugging of the memory system can be conducted using the memory system interface and the interface to the test pads simultaneously.

Variations of method 900 or methods similar to method 900 can include a number of different embodiments that may be combined depending on the application of such methods and/or the architecture of systems in which such methods are implemented. Embodiments of method 900 or methods similar to method 900 can include the memory system being a managed NAND system having a controller coupled to one or more NAND devices by a NAND bus. With the memory system being a managed NAND system, the one or more memory devices being one or more NAND memory devices, and the bus being a NAND bus, the memory system interface is a managed NAND interface, and the interface to the test pads is a NAND interface. With respect to the managed NAND system, controlling the flow of the test signals can include controlling the flow based on status of internal voltages of the one or more NAND memory devices and/or the managed NAND system monitored by the analyzer at a number of test pads of the test pads of the package platform at which the respective test pads reflect the internal voltages of the NAND memory device and/or the managed NAND system.

With respect to a managed NAND system having a controller coupled to one or more NAND memory devices by a NAND bus, variations of method 900 or methods similar to method 900 can include generating a communication from the analyzer to the test flow controller that a NAND operation is in progress; and conducting, from the test flow controller, a power loss test during the NAND operation in progress in response to the test flow controller receiving the communication that the NAND operation is in progress.

With respect to a managed NAND system having a controller coupled to one or more NAND memory devices by a NAND bus, variations of method 900 or methods similar to method 900 can include performing a number of functions. Time associated with execution of a NAND operation, from generation of a command to perform the NAND operation by the test flow controller, can be measured. Time associated with signals, corresponding to the execution of the command, on the NAND bus of the managed NAND system can be measured using the analyzer monitoring a number of test pads of the test pads of the package platform coupled to the NAND bus with the managed NAND system coupled to the package platform. Firmware of the managed NAND system can be evaluated using the measured time associated with execution of a NAND operation by the test flow controller and the measured time associated with signals on the NAND bus of the managed NAND system monitored by the analyzer.

Testing and/or debugging of a memory system can include executing instructions, stored in a device, by a processing device that can cause performance of a number of operations. The processing device can be implemented as a set of one or more processing devices, and the device storing the instructions can be implemented in or coupled to a memory system tester. The operations performed by executing such instructions by the processing device can include operations to perform the tasks of method 900, methods similar to method 900, or other techniques associated with testing and/or debugging of a memory system as taught herein. The operations performed by executing instructions by the processing device can include operations to perform functions of systems as taught herein. Variations of instructions can include a number of different embodiments that may be combined depending on the application of testing and/or debugging of a memory system and/or the architecture of systems in which such testing and/or debugging of a memory system is implemented.

The device storing such instructions can be implemented as a machine-readable storage device storing instructions, which when executed by one or more processors, cause a machine to perform operations to: generate, by a test flow controller of the machine, a flow of test signals to a memory system using a memory system interface coupled to a controller of the memory system, the memory system having one or more memory devices coupled to the controller of the memory system by a bus of the memory system; monitor, by an analyzer of the machine, test pads of a package platform for the memory system when the analyzer is coupled to the test pads of the package platform via an interface to the test pads, with the test pads coupled to the bus of the memory system, with the analyzer coupled to the test flow controller as part of a memory system tester; provide data from the analyzer to the test flow controller, the data based on real time monitoring of the test pads of the package platform; and use the data, by the test flow controller, to conduct testing and/or debugging of the memory system using the memory system interface and the interface to the test pads simultaneously, including control of the flow of the test signals based on the data.

The memory system that is the subject of the testing and/or debugging, from execution of the instructions of the machine-readable storage device, can be a managed NAND system having a controller coupled to one or more NAND memory devices by a NAND bus. With the memory system being a managed NAND system, the one or more memory devices being one or more NAND memory devices, and the bus being a NAND bus, the memory system interface is a managed NAND interface, and the interface to the test pads is a NAND interface. The operations, from execution of the instructions by the processing device, can include a determination, in real time, of an occurrence of a number of NAND page programs or block erases being greater than a threshold for page programs or block erases, by monitoring of test pads of the test pads of the package platform coupled to the NAND bus, in conjunction with control, by the test flow controller, of a flow of commands and control signals to the managed NAND system. With the memory system being a managed NAND system having a controller coupled to one or more NAND devices by a NAND bus, operations performed from execution of the instructions of the machine-readable storage device can include: maintenance of a log containing commands and addresses associated with the commands of NAND operations from monitoring of a number of the test pads coupled to the NAND bus with the managed NAND system coupled to the package platform; and performance, by the analyzer in conjunction with the test flow controller, of debugging by use of data in the log.

In various embodiments, a system can include a memory system tester that can comprise a test flow controller and an analyzer. The test flow controller can be arranged to generate test signals to a memory system. The test flow controller can be arranged to generate test signals to the memory system using a memory system interface to the memory system to couple to a controller of the memory system, the memory system having one or more memory devices coupled to the controller of the memory system by a bus of the memory system. The analyzer can be coupled to the test flow controller with the analyzer arranged to couple to test pads of a package platform for the memory system, with the analyzer operable to provide data to the test flow controller to conduct testing and/or debugging of the memory system, with the data based on real time monitoring of the test pads of the package platform. The analyzer can be arranged to couple to the test pads of a package platform for the memory system using an interface to the test pads, with the test pads coupled to the bus of the memory system such that the analyzer is operable to provide data to the test flow controller to conduct the testing and/or debugging of the memory system using the memory system interface and the interface to the test pads simultaneously. The test flow controller and the analyzer can be integrated together in a field programmable gate array system.

Variations of such a system and its features, as taught herein, can include a number of different embodiments that may be combined depending on the application of such systems and/or the architecture in which systems are implemented. Variations of a system, as taught herein, can include the test flow controller arranged to generate memory commands to the controller of the memory system via the memory system interface and to control processing of execution of memory commands by the memory system. For a program command generated for testing, the test flow controller can be arranged to stop programming the memory system in response to the data from the analyzer including a determination that programming errors in number have reached or exceeded a threshold for a number of errors allowed, the programming errors in number based on real time monitoring, by the analyzer using a number of the test pads coupled to the bus coupling the controller to one or more memory devices of the memory system. The test flow controller can be arranged to control flow of testing of the memory system based on status of internal voltages of the memory system monitored by the analyzer at a number of test pads of the package platform at which the respective test pads reflect the internal voltages of the memory system. Such a system can be structured to perform various functions, as taught herein, with respect to testing and/or debugging a memory system to which the system is coupled to conduct the respective testing and/or debugging. The memory system tester of the system can be removably coupled to the memory system via multiple interfaces.

In various embodiments, a system can include a memory system tester that can comprise a test flow controller and an analyzer. The test flow controller arranged to generate test signals to a managed NAND system via a managed NAND interface. The test flow controller can be arranged to generate test signals to the managed NAND system using the managed NAND interface to the managed NAND system to couple to a controller of the managed NAND system, the managed NAND system having one or more NAND memory devices coupled to the controller of the managed NAND system by a NAND bus of the managed NAND system. The analyzer can be coupled to the test flow controller with the analyzer arranged to couple to a set of test pads of a package platform for the managed NAND system with the analyzer operable to provide data to the test flow controller to conduct testing and/or debugging of the managed NAND system, with the data based on real time monitoring of test pads of the set of test pads of the package platform. The analyzer can be arranged to couple to the test pads of a package platform for the managed NAND system using a NAND interface to the test pads, with the test pads coupled to the NAND bus of the managed NAND system such that the analyzer is operable to provide data to the test flow controller to conduct the testing and/or debugging of the memory system using the managed NAND interface and the NAND interface to the test pads simultaneously. The test flow controller and the analyzer can be integrated together in a field programmable gate array system.

Variations of such a system and its features, as taught herein, can include a number of different embodiments that may be combined depending on the application of such systems and/or the architecture in which systems are implemented. Variations of a system, as taught herein, can include the memory system tester being operable to evaluate firmware of the managed NAND system by measurement of time associated with execution of a NAND operation, from generation of a command to perform the NAND operation by the test flow controller, and measurement of time associated with signals, corresponding to the execution of the command, on the NAND bus of the managed NAND system using a number of test pads of the set of test pads coupled to the NAND bus with the managed NAND system coupled to the package platform, where the NAND bus couples the controller of the managed NAND system to one or more NAND memory devices of the managed NAND system. The memory system tester can be operable to provide test coverage of operations on a NAND memory device of the managed NAND system and/or measure wear-leveling of the NAND memory device from monitoring a NAND bus of the managed NAND system to check the status of the NAND memory device directly.

Variations of such a system can include the test flow controller arranged to control flow of testing or debugging of a NAND memory device of the managed NAND system and/or the managed NAND system, based on the status of internal voltages of the NAND memory device and/or the managed NAND system, monitored by the analyzer at a number of test pads of the set of test pads at which the respective test pads reflect the internal voltages of the NAND memory device and/or the managed NAND system. The analyzer can be structured to be operable to communicate to the test flow controller that a NAND operation is in progress and the test flow controller can be structured to be operable to conduct a power loss test during the NAND operation in progress in response to receiving communication that the NAND operation is in progress.

Variations of such a system can include the analyzer structured as multiple NAND analyzers with each NAND analyzer arranged to access one NAND channel of multiple NAND channels of the NAND bus of the managed NAND system, with the one NAND channel being different from channels accessed by other NAND analyzers of the multiple NAND analyzers. The access by each NAND analyzer can be arranged via test pads of the set of test pads different from test pads used by the other NAND analyzers, with each NAND channel coupling one or more NAND memory dies to a controller of the managed NAND system.

Variations of such a system can include the analyzer structured to include a log to hold commands and addresses associated with commands of NAND operations from monitoring of a number of the test pads coupled to the NAND bus with the managed NAND system coupled to the package platform, where the NAND bus couples the controller of the managed NAND system to one or more NAND memory devices of the managed NAND system. The analyzer in conjunction with the test flow controller can be arranged to conduct debugging using the log.

Variations of such a system can include the analyzer, using test pads of the set of test pads, in conjunction with the test flow controller being operable to generate a command to execute an operation in a NAND memory device of the managed NAND system, measure current in the managed NAND system, correlate the current with the operation that is ongoing in the NAND memory device, and produce a statistic with respect to peak current and status of the NAND memory device. Variations of such a system can include the analyzer in conjunction with the test flow controller being operable to determine in real time when a number of NAND page programs or block erases is greater than a threshold for page programs or block erases, where the analyzer monitors test pads of the set of test pads coupled to the NAND bus with the NAND bus coupling the controller of the managed NAND system to one or more NAND memory devices of the managed NAND system.

Variations of such a system can include the analyzer being operable to generate a communication to the test flow controller that a NAND operation is in progress and can include the test flow controller being operable to conduct testing of NAND memory device power management and controller power management during the NAND operation in progress, in response to reception of the communication that the NAND operation is in progress, with the analyzer arranged to monitor internal voltages of the managed NAND system to conduct the testing in conjunction with the test flow controller.

Such a system can be structured to perform various functions, as taught herein, with respect to testing and/or debugging a managed NAND system to which the system is coupled to conduct the respective testing and/or debugging. The memory system tester of the system can be removably coupled to the managed NAND system via multiple interfaces.

Figure 10:
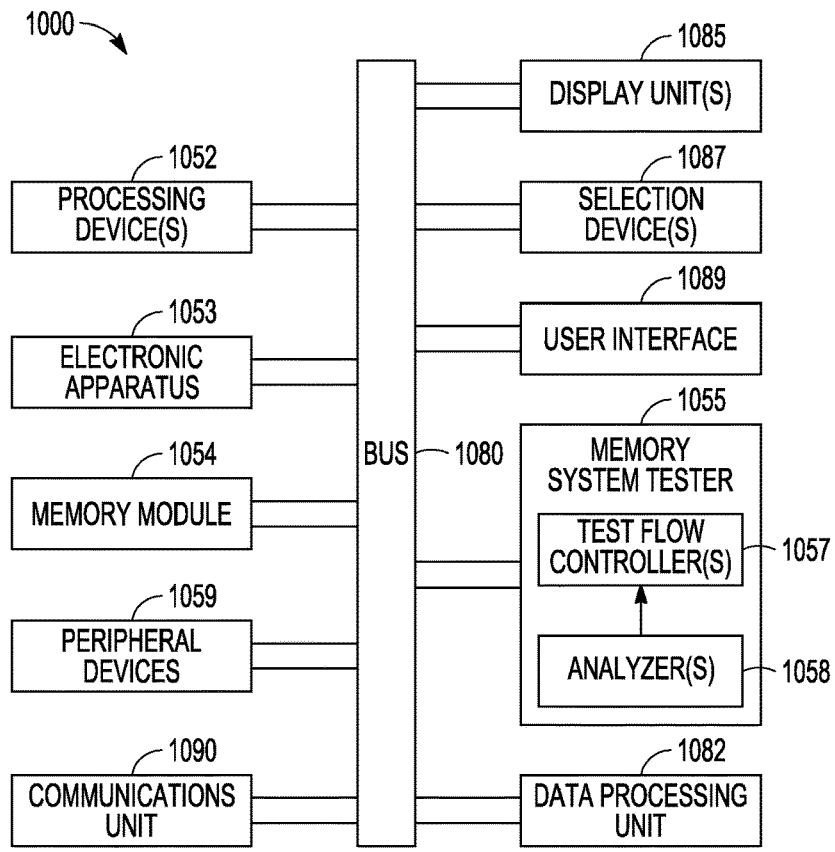
FIG. 10 is a block diagram of an example system having a memory system tester operable to test and/or debug a memory system, according to various embodiments.

FIG. 10 is a block diagram of features of an embodiment of an example system 1000 having a memory system tester 1055. The memory system tester 1055 can include one or more test flow controllers 1057 and one or more analyzers 1058 to test and/or debug a memory system. The memory system subject to testing and/or debugging is a workpiece of the memory system tester 1055 and is not shown for ease of discussion, though such a memory system can be part of the system 1000. The memory system can be, but is not limited to, a managed NAND system. The memory system tester 1055 can be structured and can have functionalities similar to the memory system tester 755 of FIG. 7, the memory system tester 855 of FIG. 8, other memory system testers as taught herein, or combinations thereof. The memory system tester 1055 or other similar memory system testers provide an integration of an analyzer with a tester that can provide advanced test features such as new test conditions, new performance measures, and an efficient low cost debug capability. The analyzer can be fully embeddable with the tester in a FPGA-based system that can provide low cost.

The system 1000 may also include a number of components such as one or more processing devices 1052, memory module 1054, communications unit 1090, data processing unit 1082, electronic apparatus 1053, peripheral devices 1059, display unit(s) 1085, user interface 1089, and selection device(s) 1087. Depending on the architecture and designed functions of the system 1000, the one or more processing devices 1052 can be realized as one or more processors, where such processors may operate as a single processor or a group of processors. Processors of the group of processors may operate independently depending on an assigned function. In controlling operation of the components of system 1000 to execute schemes associated with the functions for which system 1000 is designed, the one or more processing devices 1052 can direct access of data to and from a database.

The system 1000 can include the one or more processing devices 1052, the memory module 1054, and the communications unit 1090 arranged to operate as a processing unit to control management of the memory system tester 1055 and to perform operations on results from testing and/or debugging by the memory system tester 1055. For example, the one or more processing devices 1052, the memory module 1054, and the communications unit 1090 can be arranged to provide the results to the display unit(s) 1085, the memory module 1054, and/or to systems external to the system 1000 via the communications unit 1090. Depending on the application, the communications unit 1090 may use combinations of wired communication technologies and wireless technologies.

The memory module 1054 can include a database having information and other data such that system 1000 can operate on data to perform functions of the system 1000. The data processing unit 1082 may be distributed among the components of the system 1000 including the memory module 1054 and/or the electronic apparatus 1053.

The system 1000 can also include a bus 1080, where the bus 1080 provides electrical conductivity among the components of the system 1000. The bus 1080 may include an address bus, a data bus, and a control bus, where each may be independently configured. The bus 1080 may be realized using a number of different communication mediums that allows for the distribution of components of the system 1000. Use of the bus 1080 can be regulated by the one or more processing devices 1052. The bus 1080 may be operable as part of a communications network to transmit and receive signals including data signals and command and control signals.

In various embodiments, the peripheral devices 1059 may include drivers to provide voltage and/or current input to the memory system tester 1055, additional storage memory and/or other control devices that may operate in conjunction with the one or more processing devices 1052 and/or the memory module 1054. The display unit(s) 1085 can be arranged with a screen display that can be used with instructions stored in the memory module 1054 to implement the user interface 1089 to manage the operation of the memory system tester 1055 and/or components distributed within the system 1000. Such a user interface can be operated in conjunction with the communications unit 1090 and the bus 1080. The display unit(s) 1085 can include a video screen or other structure to visually project data/information and images. The system 1000 can include a number of selection devices 1064 operable with the user interface 1089 to provide user inputs to operate the data processing unit 1082 or its equivalent. The selection device(s) 1087 can include a touch screen or a selecting device operable with user interface 1089 to provide user inputs to operate the signal processing unit 1082 or other components of system 1000.

The following are example embodiments of systems and methods, in accordance with the teachings herein.

An example system 1 having a memory system tester 1 can include the memory system tester comprising: a test flow controller arranged to generate test signals to a memory system using a memory system interface to the memory system to couple to a controller of the memory system, the memory system having one or more memory devices coupled to the controller of the memory system by a bus of the memory system; and an analyzer coupled to the test flow controller with the analyzer arranged to couple to test pads of a package platform for the memory system using an interface to the test pads, with the test pads coupled to the bus of the memory system, such that the analyzer is operable to provide data to the test flow controller to conduct testing and/or debugging of the memory system using the memory system interface and the interface to the test pads simultaneously, the data based on real time monitoring of the test pads of the package platform.

An example system 2 having a memory system tester can include features of example system 1 having a memory system tester and can include the test flow controller and the analyzer integrated together in a field programmable gate array system.

An example system 3 having a memory system tester can include features of any of the preceding example systems having a memory system tester and can include the test flow controller arranged to control flow of testing of the memory system based on status of internal voltages of the memory system monitored by the analyzer at a number of test pads of the package platform at which the respective test pads reflect the internal voltages of the memory system.

An example system 4 having a memory system tester can include features of any of the preceding example systems having a memory system tester and can include the test flow controller being arranged to generate memory commands to the controller of the memory system via the memory system interface and to control processing of execution of memory commands by the memory system.

An example system 5 having a memory system tester can include features of any of the preceding example systems having a memory system tester and can include, for a program command generated for testing, the test flow controller being arranged to stop programming the memory system in response to the data from the analyzer including a determination that programming errors in number have reached or exceeded a threshold for a number of errors allowed, the programming errors in number based on real time monitoring, by the analyzer using a number of the test pads, of the bus coupling the controller to the one or more memory devices of the memory system.

An example system 6 having a memory system tester can include features of any of the preceding example systems having a memory system tester and can include the memory system being a managed NAND system, the one or more memory devices being one or more NAND memory devices, the bus being a NAND bus, the memory system interface being a managed NAND interface, and the interface to the test pads being a NAND interface.

An example system 7 having a memory system tester can include features of example system 6 and can include the test flow controller and the analyzer integrated together in a field programmable gate array system.

An example system 8 having a memory system tester can include features of any of the preceding example systems 6 and 7 having a memory system tester and can include the test flow controller being arranged to control flow of testing or debugging of a NAND memory device of the managed NAND system and/or the managed NAND system, based on status of internal voltages of the NAND memory device and/or the managed NAND system, monitored by the analyzer at a number of test pads of the set of test pads at which the respective test pads reflect the internal voltages of the NAND memory device and/or the managed NAND system.

An example system 9 having a memory system tester can include features of any of the preceding example systems 6-8 having a memory system tester and can include the analyzer being operable to communicate to the test flow controller that a NAND operation is in progress and the test flow controller being operable to conduct a power loss test during the NAND operation in progress in response to receiving communication that the NAND operation is in progress.

An example system 10 having a memory system tester can include features of any of the preceding example systems 6-9 having a memory system tester and can include the memory system tester being operable to evaluate firmware of the managed NAND system by measurement of time associated with execution of a NAND operation from generation of a command to perform the NAND operation by the test flow controller and measurement of time associated with signals, corresponding to the execution of the command, on the NAND bus of the managed NAND system using a number of test pads of the set of test pads coupled to the NAND bus with the managed NAND system coupled to the package platform.

An example system 11 having a memory system tester can include features of any of the preceding example systems 6-10 having a memory system tester and can include the memory system tester being operable to provide test coverage of operations on a NAND memory device of the managed NAND system and/or measure wear-leveling of the NAND memory device from a monitoring of a NAND bus of the managed NAND system to check status of the NAND memory device directly.

An example system 12 having a memory system tester can include features of any of the preceding example systems 6-11 having a memory system tester and can include the analyzer being structured as multiple NAND analyzers with each NAND analyzer arranged to access one NAND channel of multiple NAND channels of the NAND bus of the managed NAND system, the one NAND channel being different from channels accessed by other NAND analyzers of the multiple NAND analyzers, the access by each NAND analyzer arranged via test pads of the set of test pads different from test pads used by the other NAND analyzers, with each NAND channel coupling one or more NAND dies to the controller of the managed NAND system.

An example system 13 having a memory system tester can include features of any of the preceding example systems 6-12 having a memory system tester and can include the analyzer to include a log to hold commands and addresses associated with commands of NAND operations from monitoring of a number of the test pads coupled to a NAND bus with the managed NAND system coupled to the package platform.

An example system 14 having a memory system tester can include features of any of the preceding example systems 6-13 having a memory system tester and can include the analyzer in conjunction with the test flow controller being operable to conduct debugging using the log.

An example system 15 having a memory system tester can include features of any of the preceding example systems 6-14 having a memory system tester and can include the analyzer, using test pads of the set of test pads, in conjunction with the test flow controller being operable to generate a command to execute an operation in a NAND memory device of the managed NAND system, measure current in the managed NAND system, correlate the current with the operation that is ongoing in the NAND memory device, and produce a statistic with respect to peak current and status of the NAND memory device.

An example system 16 having a memory system tester can include features of any of the preceding example systems 6-15 having a memory system tester and can include the analyzer, from monitoring by use of test pads of the set of test pads coupled to the NAND bus and in conjunction with the test flow controller, being operable to determine in real time when a number of NAND page programs or block erases is greater than a threshold for page programs or block erases.

An example system 17 having a memory system tester can include features of any of the preceding example systems having a memory system tester 6-16 and can include the analyzer being operable to generate a communication to the test flow controller that a NAND operation is in progress and the test flow controller being operable to conduct testing of NAND and controller power management during the NAND operation in progress, in response to reception of the communication that the NAND operation is in progress, with the analyzer arranged to monitor internal voltages of the managed NAND system to conduct the testing in conjunction with the test flow controller.

An example processor-implemented method 1 can comprise: generating a flow of test signals from a test flow controller to a memory system using a memory system interface coupled to a controller of the memory system, the memory system having one or more memory devices coupled to the controller of the memory system by a bus of the memory system; monitoring test pads of a package platform for the memory system, using an analyzer coupled to the test pads of the package platform via an interface to the test pads, with the test pads coupled to the bus of the memory system and with the analyzer coupled to the test flow controller as part of a memory system tester; providing data from the analyzer to the test flow controller, the data based on real time monitoring of the test pads of the package platform; and using the data by the test flow controller to conduct testing and/or debugging of the memory system using the memory system interface and the interface to the test pads simultaneously, including controlling the flow of the test signals based on the data.

An example processor-implemented method 2 can include features of example method 1 and can include the test flow controller and the analyzer being integrated together in a field programmable gate array system.

An example processor-implemented method 3 can include features of any of the preceding example methods and can include the memory system being a managed NAND system, the one or more memory devices being one or more NAND memory devices, the bus being a NAND bus, the memory system interface being a managed NAND interface, and the interface to the test pads being a NAND interface.

An example processor-implemented method 4 can include features of any of the preceding example methods and can include controlling the flow of the test signals to include controlling the flow based on status of internal voltages of the one or more NAND memory devices and/or the managed NAND system monitored by the analyzer at a number of test pads of the test pads of the package platform at which the respective test pads reflect the internal voltages of the NAND memory device and/or the managed NAND system.

An example processor-implemented method 5 can include features of any of the preceding example methods and can include generating a communication from the analyzer to the test flow controller that a NAND operation is in progress; and conducting, from the test flow controller, a power loss test during the NAND operation in progress in response to the test flow controller receiving the communication that the NAND operation is in progress.

An example processor-implemented method 6 can include features of any of the preceding example methods and can include measuring time associated with execution of a NAND operation from generation of a command to perform the NAND operation by the test flow controller; measuring time associated with signals, corresponding to the execution of the command, on the NAND bus of the managed NAND system using the analyzer monitoring a number of test pads of the test pads of the package platform coupled to the NAND bus with the managed NAND system coupled to the package platform; and evaluating firmware of the managed NAND system using the measured time associated with execution of the NAND operation by the test flow controller and the measured time associated with signals on the NAND bus of the managed NAND system monitored by the analyzer.

An example processor-implemented method 7 can include features of any of the preceding example methods and can include performing functions associated with any features of example systems 1-5 having a memory system tester and example systems 6-17 having a memory system tester.

An example machine-readable storage device 1 storing instructions, that when executed by one or more processors, cause a machine to perform operations to: generate, by a test flow controller of the machine, a flow of test signals to a memory system using a memory system interface coupled to a controller of the memory system, the memory system having one or more memory devices coupled to the controller of the memory system by a bus of the memory system; monitor, by an analyzer of the machine, test pads of a package platform for the memory system when the analyzer is coupled to the test pads of the package platform via an interface to the test pads, with the test pads coupled to the bus of the memory system, with the analyzer coupled to the test flow controller as part of a memory system tester; provide data from the analyzer to the test flow controller, the data based on real time monitoring of the test pads of the package platform; and use the data, by the test flow controller, to conduct testing and/or debugging of the memory system using the memory system interface and the interface to the test pads simultaneously, including control of the flow of the test signals based on the data.

An example machine-readable storage device 2 can include features of example machine-readable storage device 1 and can include the memory system being a managed NAND system, the one or more memory devices being one or more NAND memory devices, the bus being a NAND bus, the memory system interface being a managed NAND interface, and the interface to the test pads being a NAND interface.

An example machine-readable storage device 3 can include features of any of the preceding example machine-readable storage devices and can include a determination, in real time, of an occurrence of a number of NAND page programs or block erases being greater than a threshold for page programs or block erases, by monitoring of test pads of the test pads of the package platform coupled to the NAND bus, in conjunction with control, by the test flow controller, of a flow of commands to the managed NAND system.

An example machine-readable storage device 4 can include features of any of the preceding example machine-readable storage devices and can include maintenance of a log containing commands and addresses associated with the commands of NAND operations from monitoring of a number of the test pads coupled to the NAND bus with the managed NAND system coupled to the package platform; and performance, by the analyzer in conjunction with the test flow controller, of debugging by use of data in the log.

An example machine-readable storage device 5 can include features of any of the preceding example machine-readable storage devices and can include instructions to perform operations of any features of the example processor-implemented methods 1-7, instructions to perform functions associated with any features of example systems 1-5 having a memory system tester and example systems 6-17 having a memory system tester.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A memory system tester comprising:
connections to couple to a memory system interface to test a memory system, with the memory system tester being physically different from the memory system under test and the memory system interface detachable from the memory system;
a test flow controller arranged to generate test signals to the memory system using the memory system interlace coupled externally to the memory system to couple to a controller of the memory system, the memory system having one or more memory devices coupled to the controller of the memory system by a bus of the memory system; and
an analyzer coupled to the test flow controller with the analyzer arranged to couple to external test pads of a package platform for the memory system using an interface to the external test pads, with the interface to the external test pads being separate from the memory system interface and with the external test pads coupled to the bus of the memory system, such that the analyzer is operable to provide data to the test flow controller to conduct testing of the memory system using the memory system interface and the interface to the external test pads simultaneously, the data based on real time monitoring of the external test pads of the package platform.

2. The memory system tester of claim 1, wherein the test flow controller and the analyzer are integrated together in a field programmable gate array system.

3. The memory system tester of claim 1, wherein the test flow controller is arranged to control flow of testing of the memory system based on status of internal voltages of the memory system monitored by the analyzer at a number of the external test pads of the package platform at which the respective external test pads reflect the internal voltages of the memory system.

4. The memory system tester of claim 1, wherein the test flow controller is arranged to generate memory commands to the controller of the memory system via the memory system interface and to control processing of execution of memory commands by the memory system.

5. The memory system tester of claim 4, wherein, for a program command generated for testing, the test flow controller is arranged to stop programming the memory system in response to the data from the analyzer including a determination that programming errors in number have reached or exceeded a threshold for a number of errors allowed, the programming errors in number based on real time monitoring, by the analyzer using a number of the external test, pads, of the bus coupling the controller to the one or more memory devices of the memory system.

6. The memory system tester of claim 1, wherein the memory system is a managed NAND system, the one or more memory devices are one or more NAND memory devices, the bus is a NAND bus, the memory system interface is a managed NAND interface, and the interface to the external test pads is a NAND interface.

7. The memory system tester of claim 6, wherein the test flow controller and the analyzer are integrated together in a field programmable gate array system.

8. The memory system tester of claim 6, wherein the test flow controller is arranged to control flow of testing of a NAND memory device of the managed NAND system and/or the managed NAND system, based on status of internal voltages of the NAND memory device and/or the managed NAND system, monitored by the analyzer at a number of the external test pads at which the respective external test pads reflect the internal voltages of the NAND memory device and/or the managed NAND system.

9. The memory system tester of claim 6, wherein the analyzer is operable to communicate to the test flow controller that a NAND operation is in progress and the test flow controller is operable to conduct a power loss test during the NAND operation in progress in response to receiving communication that the NAND operation is in progress.

10. The memory system tester of claim 6, wherein the memory system tester is operable to evaluate firmware of the managed NAND system by measurement of time associated with execution of a NAND operation from generation, by the test flow controller, of a command to perform the NAND operation and measurement of time associated with signals, corresponding to the execution of the command, on the NAND bus using a number of the external test pads coupled to the NAND bus with the managed NAND system coupled to the package platform.

11. The memory system tester of claim 6, wherein the memory system tester is operable to provide test coverage of operations on a NAND memory device of the managed NAND system and/or measure wear-leveling of the NAND memory device from a monitoring of the NAND bus of the managed NAND system to check status of the NAND memory device directly.

12. The memory system tester of claim 6, wherein the analyzer is structured as multiple NAND analyzers with each NAND analyzer arranged to access one NAND channel of multiple NAND channels of the NAND bus of the managed NAND system, the one NAND channel being different from channels accessed by other NAND analyzers of the multiple NAND analyzers, the access by each NAND analyzer arranged via test pads of the external test pads different from other external test pads used by the other NAND analyzers, with each NAND channel coupling one or more NAND dies to the controller of the managed NAND system.

13. The memory system tester of claim 6, wherein the analyzer includes a log to hold commands and addresses associated with commands of NAND operations from monitoring of a number of the external test, pads coupled to the NAND bus with the managed NAND system coupled to the package platform.

14. The memory system tester of claim 13, wherein the analyzer in conjunction with the test flow controller is operable to conduct debugging using the log.

15. The memory system tester of claim 6, wherein the analyzer, using selected external test pads of the external test pads, in conjunction with the test flow controller is operable to generate a command to execute an operation in a NAND memory device of the managed NAND system, measure current in the managed NAND system, correlate the current with the operation that is ongoing in the NAND memory device, and produce a statistic with respect to peak current and status of the NAND memory device.

16. The memory system tester of claim 6, wherein the analyzer, from monitoring by use of selected external test pads of the external test pads coupled to the NAND bus and in conjunction with the test flow controller, being operable to determine in real time when a number of NAND page programs or block erases is greater than a threshold for page programs or block erases.

17. The memory system tester of claim 6, wherein the analyzer is operable to generate a communication to the test flow controller that a NAND operation is in progress, and the test flow controller is operable to conduct testing of NAND and controller power management during the NAND operation in progress, in response to reception of the communication that, the NAND operation is in progress, with the analyzer arranged to monitor internal voltages of the managed NAND system to conduct the testing in conjunction with the test flow controller.

18. A processor-implemented method comprising:
testing a memory system using a memory system tester, with the memory system tester being physically different from the memory system under test and having connections coupled to a memory system interface to test the memory system, with the memory system interface detachable from the memory system, the memory system tester having a test flow controller and an analyzer, the testing including:
generating a flow of test signals from the test flow controller to the memory system using the memory system interface coupled externally to the memory system to couple to a controller of the memory system, the memory system having one or more memory devices coupled to the controller of the memory system by a bus of the memory system;
monitoring external test pads of a package platform for the memory system, using the analyzer coupled to the external test pads of the package platform via an interface to the external test pads, with the external test pads coupled to the bus of the memory system and with the analyzer coupled to the test flow controller as part of a memory, system tester, with the interface to the external test pads being separate from the memory system interface;
providing data from the analyzer to the test flow controller, the data based on real time monitoring of the external test pads of the package platform; and
using the data by the test flow controller to conduct the testing of the memory system using the memory system interface and the interface to the external test pads simultaneously, including controlling the flow of the test signals based on the data.

19. The processor-implemented method of claim 18, wherein the test flow controller and the analyzer are integrated together in a field programmable gate array system.

20. The processor-implemented method of claim 18, wherein the memory system is a managed NAND system, the one or more memory devices are one or more NAND memory devices, the bus is a NAND bus, the memory system interface is a managed NAND interface, and the interface to the external test pads is a NAND interface.

21. The processor-implemented method of claim 20, wherein controlling the flow of the test signals includes controlling the flow based on status of internal voltages of the one or more NAND memory devices and/or the managed NAND system monitored by the analyzer at a number of the external test pads of the package platform at which the respective external test pads reflect the internal voltages of the NAND memory device and/or the managed NAND system.

22. The processor-implemented method of claim 20, wherein the processor-implemented method includes:
generating a communication from the analyzer to the test flow controller that a NAND operation is in progress; and
conducting, from the test flow controller, a power loss test during the NAND operation in progress in response to the test flow controller receiving the communication that the NAND operation is in progress.

23. The processor-implemented method of claim 20, wherein the processor-implemented method includes:

measuring time associated with execution of a NAND operation from generation, by the test flow controller, of a command to perform the NAND operation;

measuring time associated with signals, corresponding to the execution of the command, on the NAND bus of the managed NAND system using the analyzer monitoring a number of the external test pads of the package platform coupled to the NAND bus with the managed NAND system coupled to the package platform; and evaluating firmware of the managed NAND system using the measured time associated with execution of the NAND operation by the test flow controller and the measured time associated with signals on the NAND bus of the managed NAND system monitored by the analyzer.

24. A non-transitory machine-readable storage device storing instructions, that when executed by one or more processors, cause a machine to perform operations to:

test a memory system using a memory system tester, with the memory system tester being physically different from the memory system under test and having connections coupled to a memory system interface to test the memory system, with the memory system interface detachable from the memory system, the memory system tester having a test flow controller and an analyzer, the testing including operations to:

generate, by the test flow controller of the machine, a flow of test signals to a memory system using the memory system interface coupled externally to the memory system to couple to a controller of the memory system, the memory system having one or more memory devices coupled to the controller of the memory system by a bus of the memory system;

monitor, by the analyzer of the machine, external test pads of a package platform for the memory system when the analyzer is coupled to the external test pads of the package platform via an interface to the external test pads, with the external test pads coupled to the bus of the memory system, with the analyzer coupled to the test flow controller as part of a memory system tester, with the interface to the external test pads being separate from the memory system interface;

provide data from the analyzer to the test flow controller, the data based on real time monitoring of the external test pads of the package platform; and use the data, by the test flow controller, to conduct testing of the memory system using the memory system interface and the interface to the external test pads simultaneously, including control of the flow of the test signals based on the data.

25. The non-transitory machine-readable storage device of claim 24, wherein the memory system is a managed NAND system, the one or more memory devices are one or more NAND memory devices, the bus is a NAND bus, the memory system interface is a managed NAND interface, and the interface to the external test pads is a NAND interface.

26. The non-transitory machine-readable storage device of claim 25, wherein the operations include a determination, in real time, of an occurrence of a number of NAND page programs or block erases being greater than a threshold for page programs or block erases, by monitoring of selected external test pads of the external test pads of the package platform coupled to the NAND bus, in conjunction with control, by the test flow controller, of a flow of commands to the managed NAND system.

27. The non-transitory machine-readable storage device of claim 25, wherein the operations include:

maintenance of a log containing commands and addresses associated with the commands of NAND operations from monitoring of a number of the external test pads coupled to the NAND bus with the managed NAND system coupled to the package platform; and performance, by the analyzer in conjunction with the test flow controller, of debugging by use of data in the log.

\* \* \* \* \*